United States Patent
Ko et al.

(10) Patent No.: US 11,676,817 B2
(45) Date of Patent: Jun. 13, 2023

(54) METHOD FOR PITCH SPLIT PATTERNING USING SIDEWALL IMAGE TRANSFER

(71) Applicant: Tokyo Electron Limited, Tokyo (JP)

(72) Inventors: Akiteru Ko, Albany, NY (US); Richard Farrell, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 384 days.

(21) Appl. No.: 16/916,452

(22) Filed: Jun. 30, 2020

(65) Prior Publication Data

US 2021/0407804 A1  Dec. 30, 2021

Related U.S. Application Data

(60) Provisional application No. 62/886,464, filed on Aug. 14, 2019.

(51) Int. Cl.
*H01L 21/033* (2006.01)
*G03F 7/09* (2006.01)
(Continued)

(52) U.S. Cl.
CPC .......... *H01L 21/0338* (2013.01); *G03F 7/091* (2013.01); *G03F 7/11* (2013.01); *G03F 7/2004* (2013.01); *G03F 7/2006* (2013.01); *G03F 7/2041* (2013.01); *G03F 7/26* (2013.01); *H01L 21/0275* (2013.01); *H01L 21/0276* (2013.01); *H01L 21/0335* (2013.01); *H01L 21/0337* (2013.01)

(58) Field of Classification Search
CPC ............. H01L 21/0338; H01L 21/0275; H01L 21/0276; H01L 21/0335; H01L 21/0337; G03F 7/091; G03F 7/11; G03F 7/2004; G03F 7/2006; G03F 7/2041; G03F 7/26; G03F 7/094

USPC ......................................................... 438/700
See application file for complete search history.

(56) References Cited

U.S. PATENT DOCUMENTS 7,538,026 B1 * 5/2009 Ghandehari ........ H01L 21/0276
257/E21.495
2010/0210111 A1   8/2010 Tran et al.
(Continued)

FOREIGN PATENT DOCUMENTS

KR     1020090073157 A    7/2009

OTHER PUBLICATIONS

Korean Intellectual Property Office, The International Search Report and the Written Opinion for International application No. PCT/US2020/040226, dated Oct. 15, 2020, 14 pg.

*Primary Examiner* — Caleen O Sullivan
(74) *Attorney, Agent, or Firm* — Slater Matsil, LLP

(57) ABSTRACT

A method of forming a device includes forming a hard mask layer over an underlying layer of a substrate, forming an anti-reflective coating layer over the hard mask layer, forming a patterned resist layer over the anti-reflective coating layer, and forming a mandrel including the anti-reflective coating layer by patterning the anti-reflective coating layer using the patterned resist layer as an etch mask. The method includes forming a sidewall spacer on the mandrel including the anti-reflective coating layer, forming a freestanding spacer on the hard mask layer by removing the mandrel from the anti-reflective coating layer, and using the freestanding spacer as an etch mask, patterning the underlying layer of the substrate.

17 Claims, 6 Drawing Sheets

(51) Int. Cl.
*G03F 7/11* (2006.01)
*G03F 7/20* (2006.01)
*G03F 7/26* (2006.01)
*H01L 21/027* (2006.01)

(56) References Cited

U.S. PATENT DOCUMENTS

2012/0205818 A1   8/2012  Lin
2012/0302057 A1  11/2012  Arnold et al.
2015/0155198 A1   6/2015  Tsai et al.
2018/0138078 A1*  5/2018  Farrell ................ H01L 21/0332

\* cited by examiner

METHOD FOR PITCH SPLIT PATTERNING USING SIDEWALL IMAGE TRANSFER

CROSS-REFERENCE TO RELATED APPLICATIONS

This application claims the benefit of U.S. Provisional Application No. 62/886,464, filed on Aug. 14, 2019, which application is hereby incorporated herein by reference.

BACKGROUND

The present invention relates generally to methods for patterning a layer on a substrate, which includes, in particular, patterning of semiconductor devices.

Generally, a semiconductor device, such as an integrated circuit (IC) is fabricated by sequentially depositing and patterning layers of dielectric, conductive, and semiconductor materials over a semiconductor substrate to form a network of electronic components and interconnect elements (e.g., transistors, resistors, capacitors, metal lines, contacts, and vias) integrated in a monolithic structure. At each successive technology node, the minimum feature sizes are shrunk to reduce cost by roughly doubling the component packing density.

The various layers are generally patterned using a photolithography process. The substrate is first coated with a photoresist, and then exposed to a pattern of actinic radiation using a photolithography system. After exposure, a relief pattern is developed using a solvent that removes a portion of the photoresist layer. In a direct photolithography process the patterned photoresist is the etch mask used to transfer the pattern to underlying target layers. Here, the minimum feature size would be roughly the optical resolution of the photolithography system. Methods for improving the resolution limit of a photolithography system comprise using a shorter wavelength radiation source, for example, 193 nm ArF laser instead of 248 nm KrF laser, and increasing the numerical aperture (NA) by immersion photolithography, wherein the air in the region between the substrate and the system of lenses in the photolithography system is replaced by a medium with a higher refractive index such as water. However, it is extremely challenging to extend the resolution limit of an optical system below 38 nm.

Instead, multiple patterning techniques have been developed to print features at a pitch below the resolution limit of the photolithography system. By using these techniques, 193 nm immersion photolithography has been extended to create patterned layers having features at a pitch less than 30 nm. For example, in a simple double patterning pitch splitting method the target pattern may be split into two patterns, each having features at a pitch within the optical resolution limit. These two patterns may be combined to form a patterned mask having features at a sub-resolution pitch. The concern of overlay error in combining two patterns has led to the development of self-aligned pitch splitting techniques such as sidewall image transfer (SIT). The self-aligned double patterning with SIT (SADP-SIT) process uses the optical system just once to print a photoresist mask with features at the optical resolution limit. Then the SIT technique is used to form a layer with double the feature density. In the SIT technique, a sacrificial mandrel layer is patterned at the minimum pitch and sidewall spacers are formed around the mandrels. The mandrels are then removed selectively to leave a pattern of spacers at one-half the pitch of the resolution limit for the photolithography system. The half-pitch spacer pattern may be used as a masking layer to transfer the pattern to one or more underlying layers. This SADP-SIT process may also be repeated for self-aligned quadruple patterning (SAQP) to generate another spacer pattern at a quarter of the minimum pitch for the photolithography system.

The additional processing cost incurred with using multiple patterning to pattern a target layer may be a tolerable penalty for a semiconductor IC fabrication process flow in which sub-resolution features are needed at one or two critical levels. As techniques such as pitch splitting patterning using SIT are applied at an increasing number of patterning levels, innovative methods are needed to reduce the manufacturing cost.

SUMMARY

In accordance with an embodiment, a method of patterning a substrate includes depositing an anti-reflective coating layer on a layer stack on a substrate and depositing a layer of photoresist on the substrate subsequent to depositing the anti-reflective coating layer. The method includes forming a latent pattern within the layer of photoresist by exposing the layer of photoresist to a pattern of actinic radiation, developing the layer of photoresist resulting in a relief pattern that includes mandrels, and transferring the relief pattern into the anti-reflective coating layer using a directional etch process. The anti-reflective coating layer resulting in the relief pattern that includes mandrels. The method includes removing the layer of photoresist from the substrate, forming sidewall spacers on mandrels formed from the anti-reflective coating layer, removing the mandrels formed from the anti-reflective coating layer while leaving the sidewall spacers on the substrate, and transferring a pattern defined by the sidewall spacers into one or more underlying layers.

In accordance with an embodiment, a method of forming a device includes forming a hard mask layer over an underlying layer of a substrate, forming an anti-reflective coating layer over the hard mask layer, forming a patterned resist layer over the anti-reflective coating layer, and forming a mandrel including the anti-reflective coating layer by patterning the anti-reflective coating layer using the patterned resist layer as an etch mask. The method includes forming a sidewall spacer on the mandrel including the anti-reflective coating layer, forming a freestanding spacer on the hard mask layer by removing the mandrel from the anti-reflective coating layer, and using the freestanding spacer as an etch mask, patterning the underlying layer of the substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3C, 4-5, 6A-6C, and 7 illustrate cross-sectional views of a semiconductor device at various intermediate stages of a pitch splitting, self-aligned double patterning process flow using sidewall image transfer, in accordance with an embodiment of the invention, wherein FIG. 3A illustrates an incoming wafer with stacked layers, FIGS. 3B and 3C illustrates the wafer after undergoing pre-lithography process steps, wherein FIG. 4 illustrates the wafer after forming a photoresist relief pattern over the protected organic BARC layer, wherein FIG. 5 illustrates the wafer after forming a patterned mandrel layer after the BARC patterning steps, wherein FIGS. 6A-6C illustrate the wafer during processing steps used to form a half-pitch spacer pattern, and wherein FIG. 7 illustrates the wafer after the pattern transfer process.

DETAILED DESCRIPTION OF ILLUSTRATIVE EMBODIMENTS

Figure 1:
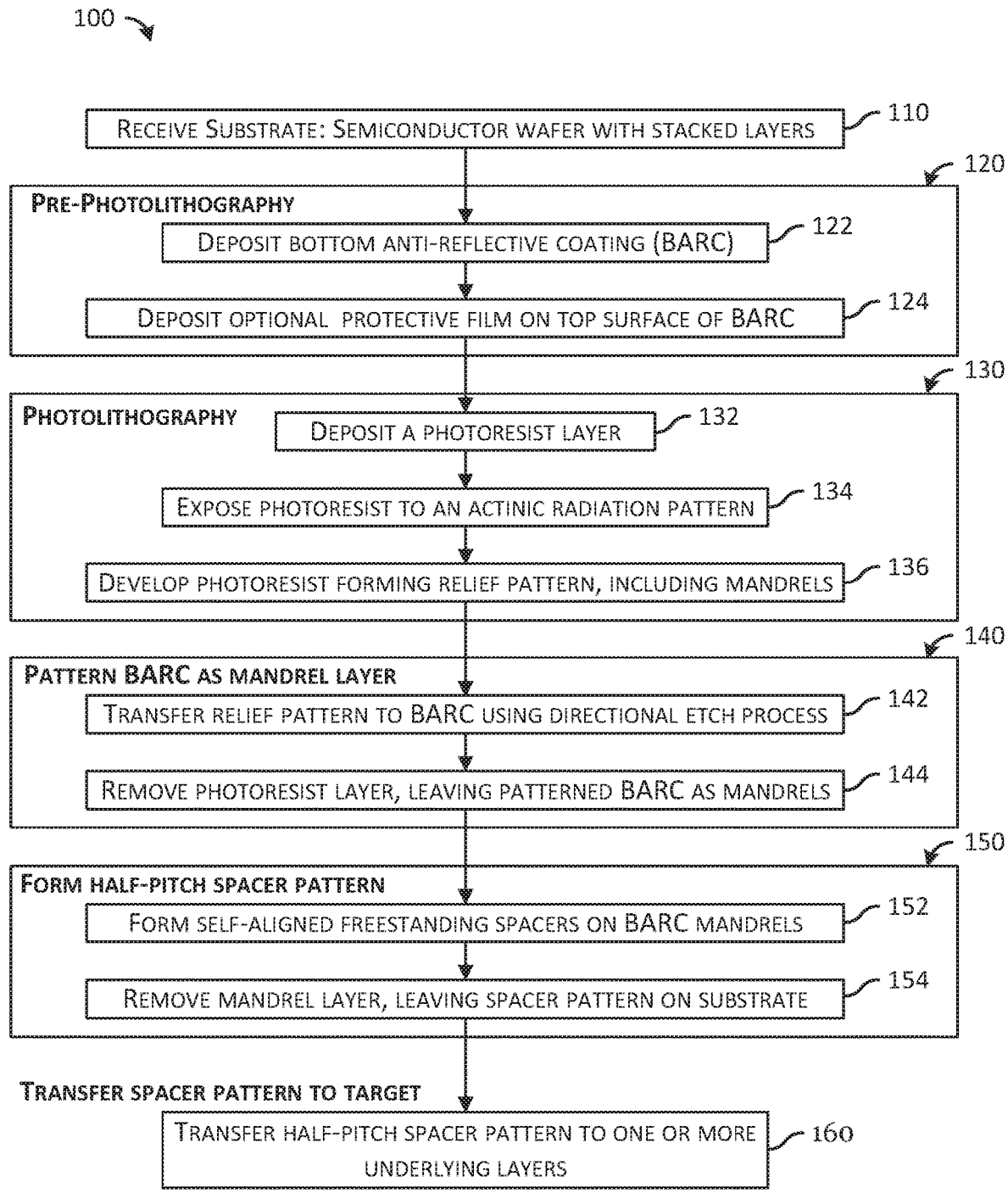
FIG. 1 is a flow diagram of a pitch splitting, self-aligned double patterning process using sidewall image transfer, in accordance with an embodiment of the invention.

This disclosure describes a pitch splitting, self-aligned double patterning (SADP) process flow utilizing innovative sidewall image transfer (SIT) methods. The methods are equally applicable to other multiple patterning processes using SIT; for example, self-aligned quadruple patterning (SAQP) process using SIT. The embodiments described in this document provide the dual advantage of low processing cost and high fidelity image transfer.

As known to persons skilled in the art, multiple patterning techniques (e.g., SADP-SIT/SAQP-SIT) used in IC fabrication add process steps and complexity in order to enable patterning of layers with sub-resolution features; for example, an array of parallel lines printed at a pitch that is one-half of the minimum pitch of the photolithography system using, for example, SADP-SIT, or one-quarter of the minimum pitch of the photolithography system using, for example, SAQP with SIT. The SIT technique generally comprises first patterning an array of mandrels arranged in a pitch at the resolution limit of the photolithography system, followed by forming self-aligned spacers on the sidewalls of the mandrels, and then selectively pulling the mandrels, thereby printing an array of spacers with double the number of lines than the number of mandrel lines in the initial array from which the spacer pattern was formed. Accordingly, the spacer pattern has a pitch that is one-half times the minimum pitch of the photolithography system. Repeating this process would quadruple the pattern density and provide a new spacer pattern achieving one-quarter times the minimum pitch of the photolithography system.

The demand for doubling the packing density at each successive technology node has been driving up the fraction of the total number of patterning levels where multiple patterning (e.g., SADP and SAQP) may be used. The associated extra deposition and etch steps diminishes the benefit of miniaturization by increasing the processing cost per patterning level of the respective IC fabrication process. It is important to contain processing cost, but some cost reduction methods may compromise pattern quality, as explained further below. A low-cost SADP-SIT process that results in a half-pitch pattern with degraded metrics, such as critical dimension (CD) control, linewidth roughness (LWR), and line edge roughness (LER), may not be desirable. The embodiments in this disclosure provide the advantage of reducing processing cost while maintaining the high quality of the half-pitch pattern produced using more expensive SADP-SIT process flows.

First, an SADP-SIT process flow used for the disclosed embodiments is described with reference to the flow diagram illustrated in FIG. 1. Next, using FIGS. 2A-2E, an alternative low-cost SADP-SIT process has been described as a reference SADP-SIT process to illustrate the potential of loss in pattern quality with cost reduction, and to underscore the advantage of maintaining pattern quality while reducing cost, as provided by the disclosed embodiments of SADP-SIT processes, which use the process flow described by the flow diagram in FIG. 1. The description of the disclosed embodiments, illustrated in FIGS. 3A-7, explains that the improvements in patterning metrics of the disclosed low-cost SADP-SIT processes relative to the reference low-cost SADP-SIT process are equivalent to what may otherwise be achieved at a higher processing cost. The extra cost would be associated with adding a layer to be used as a dedicated mandrel layer in the more expensive SADP-SIT process flow.

FIG. 1 illustrates a flow diagram that describes a process flow 100 used in the embodiments of the SADP-SIT processes described in this disclosure. The process flow 100 starts with receiving an incoming substrate, for example, a semiconductor wafer with stacked layers, as indicated in block 110. In the process flow 100, it is assumed that the topmost layer of the incoming substrate is included among the layers patterned using the half-pitch spacer pattern to be formed over the incoming substrate during execution of the SADP-SIT process flow 100.

In IC manufacturing, patterning layers comprise using the photolithography process, wherein the process starts by coating a surface with a photoresist layer. The photoresist is exposed to a pattern of actinic radiation and a relief pattern is developed with a solvent. As known to a person skilled in the art, reflections of the incident radiation from interfaces underlying the photoresist may cause interference patterns within the photoresist that degrade the pattern quality of the relief pattern by exacerbating undesirable phenomena such as LER and reflective notching. One method for reducing the impact of interference patterns is to suppress the reflections using an anti-reflective coating. Prior to photolithography, an anti-reflective coating (ARC) is formed on the top surface of the incoming substrate, as indicated by box 122 in the pre-photolithography block 120 of the process flow 100. Since the ARC would be below the photoresist, it is referred to as a bottom ARC (BARC). In general, both inorganic and organic films may perform adequately in suppressing reflections when used as the BARC layer in the process flow 100. However, organic BARC provides several advantages over inorganic BARC. The anti-reflective property of inorganic BARC arises from destructive interference of radiation reflected from the top and bottom surfaces of the BARC, whereas organic BARC works by simply absorbing the radiation. Thus, the film thickness control may be relaxed for organic BARC layers. Inorganic BARC is generally deposited using, for example, chemical vapor deposition (CVD). In contrast, organic BARC may be a flowable material spin-coated on the substrate in the track system; thus avoiding the complexity of transferring wafers between the track system and the CVD tool. Spin-coating provides the added benefit of improving the planarity of the surface. Improved planarity is advantageous for patterning with a high NA optical system (e.g., a 193 nm ArF immersion photolithography system) that naturally has a low depth-of-focus.

As known to persons skilled in the art, a track system may lower the manufacturing cost of patterning by assembling a series of process modules used to perform many of the non-optical steps in photolithography. Wafers may be transported between modules for automated sequential processing using robotic and belt-handling. The equipment set in a sequential track system may comprise, for example, coater modules for spin-coating wafers with liquids such as photoresist, spin-on glass (SOG), organic BARC, and spin-on carbon (SOC); a small vacuum chamber for conformal deposition of, for example, hexamethyldisilazane (HMDS), a common adhesion promoter; ovens suitable for resist bake; a developer module for relief etching photoresist exposed to radiation; and a cleaning unit equipped with brushes and pressurized water jets.

In the SADP-SIT process flow 100, the BARC layer is used subsequently as the mandrel layer. Thus, in processes using organic BARC, a thin protective film may be formed over the top surface of the BARC, as indicated in box 124 of the pre-lithography block 120. Examples of processes that may be used to form the thin protective film are described further below in the context of the example embodiments in FIGS. 3A-7. The thin protective film helps reduce sidewall tapering and corner rounding caused by damage during subsequent plasma enhanced deposition of spacer material. Since inorganic BARC is generally more resistant to plasma damage, a protection layer may be unnecessary.

As shown in the process flow 100 in FIG. 1, after forming the BARC layer and the optional thin protective film is complete, a photolithography process (block 130) may be performed using, for example, a 193 nm ArF immersion photolithography system or a 13.5 nm extreme ultraviolet (EUV) lithography.

In box 132, the top surfaces of a batch of semiconductor wafers may be spin-coated by photoresist in the coating module of a track system and subsequently moved to an optical system, for example, a projection scanner. As indicated in box 134, the photoresist is exposed to an actinic radiation pattern in the scanner. The scanner shines a laser beam on a reticle patterned with opaque features. A portion of the pattern may be projected onto a coated wafer using a lens system. Generally, a step-and-scan technique is used to expose the wafer surface to the radiation pattern. After the reticle and the wafer are aligned, either one or both may be moved synchronously to scan one complete field of the pattern over an area of the wafer. Being located on opposite sides of the lens, the reticle and the wafer may move in opposite directions. After scanning one field, the wafer is stepped to bring a nearby unexposed area below the lens, and the scanning process is repeated.

As indicated in box 136 of the lithography block 130, after exposure, the wafer may be returned to the track system to develop the relief pattern in the developer module using a photoresist solvent. For a positive resist, the relief etch would remove photosensitive material from areas unexposed to radiation and vice versa for a negative photoresist, leaving behind a photoresist pattern on the surface. In an SADP-SIT process flow (e.g., process flow 100 in FIG. 1) the pattern comprises photoresist features at the minimum pitch of the photolithography system if the pitch split patterning is used to print a half-pitch pattern on the target layer.

Although, not shown explicitly in the flow diagram of the SADP-SIT process flow 100, it is understood that the photolithography block 130 may include additional process steps such as pre-exposure and/or post-exposure photoresist bake performed in the track system.

In a more expensive conventional SADP-SIT process, the patterned photoresist layer would be the etch mask in a directional etch process used to transfer the photoresist pattern to a sacrificial dedicated mandrel layer in the substrate below the photoresist and BARC layers. In contrast, in the process flow 100, the BARC doubles as the mandrel layer. By reusing the BARC as the mandrel layer in block 140, the process flow 100 eliminates the cost of a dedicated mandrel layer. This cost reduction can be achieved without degrading the pattern quality of the target layer. In a possible alternative method, the dedicated mandrel layer may be eliminated if the photoresist itself is the mandrel layer. In this alternative approach, the photoresist mandrels may deform during subsequent processing, which results in a degraded half-pitch pattern transferred to the target layers, as described below with reference to FIGS. 2A-2E.

The mandrel layer is patterned in block 140 of the process flow 100. In box 142, a directional etch process is performed to transfer the photoresist pattern to the underlying BARC, for example, an organic BARC with a thin protective film on top. After the etching is complete, the photoresist mask is stripped, as indicated in box 144.

In block 150, the patterned BARC layer is used as the sacrificial mandrel layer for forming the half-pitch spacer pattern of the SIT process in process flow 100. In box 152, self-aligned spacers are formed on the sidewalls of the mandrels. The self-aligned spacer process in box 152 may comprise a conformal deposition step followed by a directional etch step. First, a layer of spacer material is formed conformally covering the surface of the wafer, including the sidewalls, the top thin protective film, and the floor between mandrels. The spacer material is then selectively removed from over the top surfaces of the mandrels and the floors of the spaces between mandrels using a directional spacer etch process that leaves the spacer material substantially in place along the sidewalls of mandrels. The spacer etch may also remove the thin protective film, thereby exposing the top surface of the organic BARC layer along with the top surface of the topmost layer of the substrate between the bases of the mandrels.

In box 154 of block 150 of the process flow 100, a mandrel-pull etch process is performed. The mandrel-pull etch removes the mandrels selectively to leave behind a pattern comprising spacers formed over the topmost layer of the incoming substrate of the process flow 100. Since spacers have been formed on each pair of opposing sidewalls of a mandrel, the features in the spacer pattern are at half the pitch of the mandrel pattern.

The half-pitch spacer pattern formed in block 150 is used in block 160 as a masking layer to perform an etch that transfers the half-pitch spacer pattern to one or more underlying layers in the substrate below the spacers.

The process flow 100, described above with reference to FIG. 1, eliminates the cost of a dedicated mandrel layer by reusing the BARC as the mandrel layer. In a possible alternative method, the dedicated mandrel layer may be eliminated if the patterned photoresist itself is the mandrel layer, as illustrated in FIGS. 2A-2E.

Figure 2A:
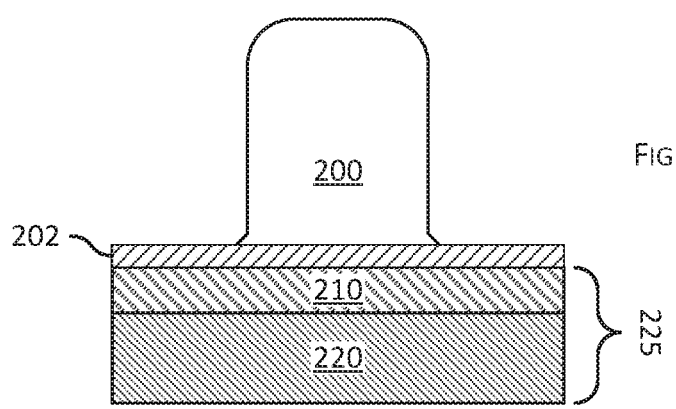
FIGS. 2A-2D illustrate cross-sectional views of a semiconductor device at various intermediate stages of a hypothetical pitch splitting, self-aligned double patterning process flow using sidewall image transfer.

FIG. 2A illustrates a patterned photoresist layer 200 and a BARC layer 202 over a substrate 225. Here, the patterned photoresist layer 200 is the mandrel layer for the respective SADP-SIT process. In this example, the topmost layer 210 of the substrate 225 is one of the target layers to be patterned subsequently using a half-pitch spacer pattern. Other layers of the substrate 225 are collectively shown as the bottom layer 220. As illustrated in FIG. 2A, the example mandrel in the patterned photoresist layer 200 has near-vertical sidewalls with rounded edges near the top and a small foot near the base.

Figure 2B:
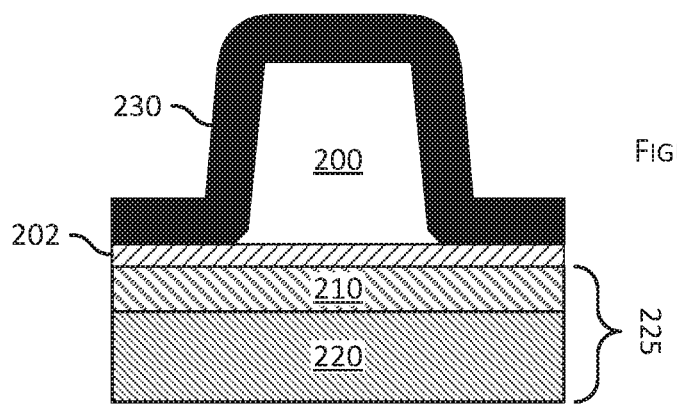

In FIG. 2B, a spacer layer 230 has been formed conformally over the top surface of the exposed BARC layer 202 and the patterned photoresist layer 200. The conformal deposition process may be performed at a low temperature to avoid damaging the photoresist pattern. The processing temperature may not exceed a specified maximum temperature for the photoresist. Conformal deposition at low temperatures is usually done using a plasma enhanced deposition process. The photoresist mandrels may be deformed by collisions and chemical reactions with energetic ions and radicals (e.g., argon ions and oxygen radicals) present in the plasma. The plasma damage may be higher near the top edges of the patterned photoresist layer 200. Furthermore, since photoresist has low stiffness, mechanical stress in the spacer layer may squeeze the lines of the patterned photoresist layer 200, resulting in mandrels with tapered sidewalls, as illustrated in FIG. 2B.

Figure 2C:
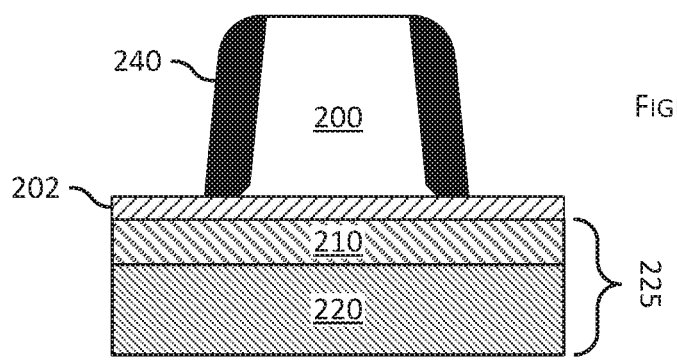

FIG. 2C illustrates the structure of FIG. 2B after a directional etch has been performed to remove portions of the spacer layer 230 selectively from over the roughly flat top surfaces of the patterned photoresist layer 200 and the BARC layer 202, forming sidewall spacers 240. The edge profiles of the spacers 240 reflect the tapered sidewall profiles of the respective mandrels in the patterned photoresist layer 200.

Figure 2D:
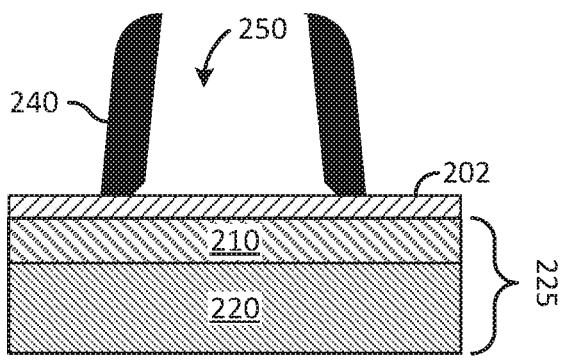

In FIG. 2D, the patterned photoresist layer 200 has been selectively removed by a suitable mandrel pull etch process, leaving spaces 250 in the region occupied by the mandrels. A half-pitch spacer pattern comprising freestanding spacers 240 may remain over the BARC layer 202. The edges of a pair of freestanding spacers 240 reflect the edges of the respective mandrel that was separated from the pair. As illustrated in FIG. 2D, the spacers 240 remain tilted. When the leaning spacers are used as the etch mask, etch shadowing due to the tilt may broaden the average linewidth and reduce the edge sharpness of the respective feature in the target layer. Also, tilted structures with a high aspect ratio generally have reduced mechanical stability. This may increase the number of patterning defects in the target layer caused by random excessive tilting or toppling of spacers 240.

Figure 2E:
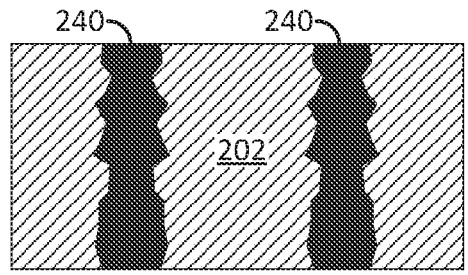
FIG. 2E illustrates a planar view of a semiconductor device at an intermediate stage of a hypothetical pitch splitting, self-aligned double patterning process flow using sidewall image transfer, shown in the cross-sectional view illustrated in FIG. 2D.

The top-down planar view in FIG. 2E corresponds to the cross-sectional view in FIG. 2D. Two lines in FIG. 2E correspond to the two spacers 240 in FIG. 2D. The BARC layer 202 is visible in the top-down view in FIG. 2E everywhere outside the spacers 240. The line-shape of the spacers 240 indicates that the plasma damage during conformal deposition the spacer layer 230 in FIG. 2B may have roughened the sidewalls of mandrels in the patterned photoresist layer 200. The increased taper and roughness of the mandrel during deposition of the spacer layer 230 in FIG. 2B may propagate down the process flow to degrade several pattern quality metrics of the spacer pattern after mandrel pull in FIGS. 2D and 2E. A poorly controlled tilt angle in the patterned photoresist layer 200 (in FIG. 2B) degrades CD control of the spacer pattern comprising freestanding spacers 240 (in FIG. 2E) because of broadening of the average spacer linewidth due to tilt. The increased sidewall roughness in the patterned photoresist layer 200 (in FIG. 2B) due to plasma damage increases the rms line-shape variations of freestanding spacers 240 (in FIG. 2E) in the spacer pattern, as expressed by the LER and LWR metrics of patterned lines. When the pattern comprising spacers 240 is used as a masking layer, the degraded metrics of the pattern of spacers 240 may translate to degraded CD control, LER, and LWR metrics in the half-pitch patterns printed using the spacer pattern.

Photoresists generally comprise soft deformable materials that may be easily damaged by ion sputtering and oxidized by oxygen radicals. Thus, the tapering deformation and surface roughness enhancement of photoresist mandrels, described above, may be avoided by first transferring the photoresist pattern to a dedicated mandrel layer comprising materials that are stiffer and more resistant to plasma damage. The deposition and removal of the added dedicated mandrel layer adds cost to the IC fabrication process flow.

As mentioned above, process flow 100 (illustrated by the flow diagram in FIG. 1) achieves the same benefit of adding a dedicated mandrel layer, but at a reduced cost by using the BARC layer as the mandrel layer. As also explained above, organic BARC provides several advantages over inorganic BARC. Accordingly, an organic BARC layer has been used in the example embodiment for the SADP-SIT process flow 100, described below with reference to FIGS. 3A-7. In comparison to photoresist, organic BARC is more resistant to plasma damage and oxidation. Although carbon in the organic polymers in organic BARC may react with oxygen during a subsequent spacer deposition process step (to form, e.g., gaseous oxides of carbon), the damage to organic BARC mandrels may be tolerable.

Organic BARC is usually not as stiff as inorganic BARC, and may not be immune to oxidation when exposed to oxygen plasma. In the example embodiment for the SADP-SIT process flow 100, described below with reference to FIGS. 3A-7, a thin protective film may be formed over the top surface of the organic BARC prior to coating the photoresist material. Thus protected, the plasma damage and tapering deformation of the organic BARC during spacer layer deposition may be diminished to an acceptable level.

Figure 3A:
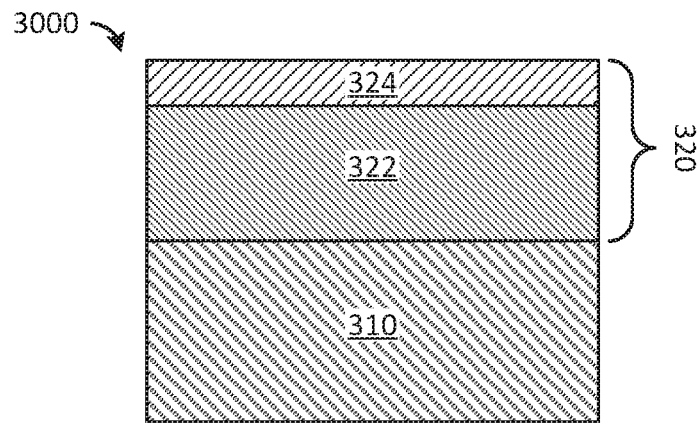

FIG. 3A illustrates an incoming wafer 3000 with stacked layers, as described in block 110 of process flow 100 in FIG. 1. The target layer 320 for the half-pitch pattern of the example SADP-SIT process flow 100 is the topmost layer of the incoming wafer 3000. All other layers are collectively shown as layer 310. Target layer 320 comprises a primary layer 322 and a relatively thin cover layer 324 formed over the primary layer 322. The primary layer 322 may comprise, for example, spin-on carbon (SOC), or materials such as amorphous carbon formed using CVD, having a thickness of about 30 nm to about 200 nm. The cover layer 324 may comprise, for example, SOG, or materials formed using CVD such as silicon oxynitride ($SiO_xN_y$), silicon dioxide, silicon carbide, and metal oxide having a thickness of about 5 nm to about 35 nm.

Figure 3B:
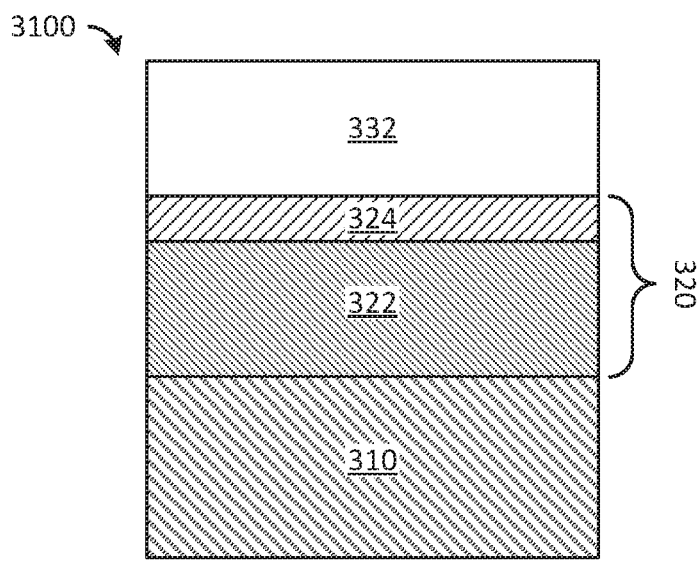
Figure 3C:
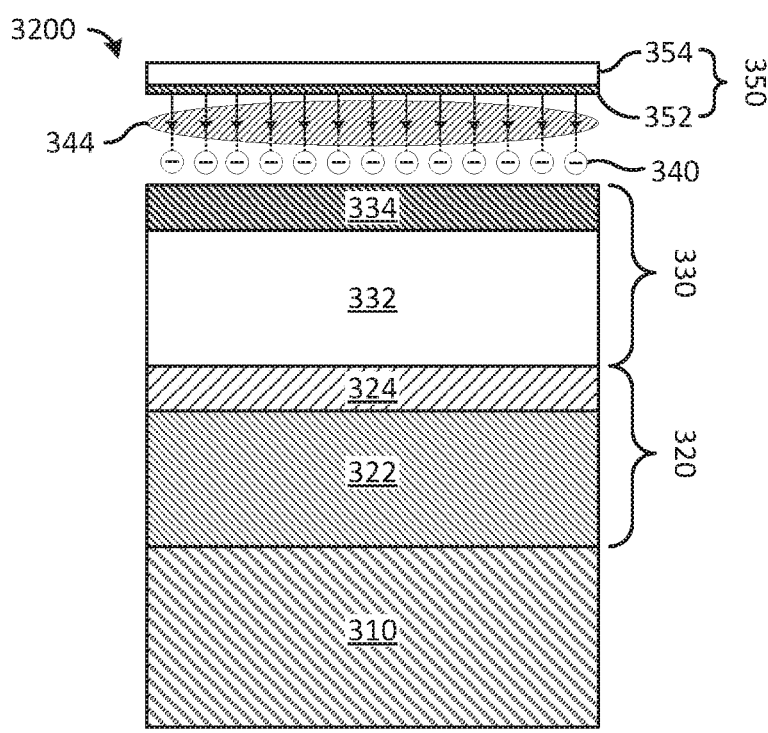

FIGS. 3B and 3C illustrate the pre-lithography process steps indicated in block 120 of the SADP-SIT process flow 100, illustrated in FIG. 1.

FIG. 3B illustrates a stack of layers 3100 after an organic BARC layer 332 has been formed over the target layer 320 the incoming wafer 3000 (see FIG. 3A). The material and thickness of the organic BARC layer 332 may be selected in accordance with the wavelength of the illuminating laser, the reflectivity of the substrate below the BARC, and the thickness and optical properties of the photoresist used. In one embodiment, the organic BARC layer 332 may be about 25 nm to about 100 nm thick.

Organic films, such as the organic BARC layer 332 in FIG. 3B, may be hardened by curing processes (e.g., plasma treatment, heat treatment, and ultra-violet radiation treatment) that enable cross-linking of carbon-to-carbon bonds.

A protective film 334 may be optionally formed over the organic BARC layer 332, thereby forming the protected organic BARC layer 320. Although the thin protective film may comprise different materials, depending on the deposition process used and the stage of the process flow, the same numeral 334 has been used in this document for the sake of simplicity. In some embodiment, the forming the protective film 334 may be omitted.

As explained above, the protective film 334 protects the top corners and edges from plasma damage in a subsequent plasma deposition step used to form a spacer layer. Generally, the protective film 334 may be less than 5 nm thick, and comprise a relatively stiff inorganic material that may be removed during an overetch portion of a subsequent spacer etch process. In various embodiments, the protective film 334 may be formed using any suitable deposition technique, such as physical vapor deposition (PVD), sputter deposition, atomic layer deposition (ALD), plasma-enhanced ALD (PEALD), chemical vapor deposition (CVD), plasma-enhanced CVD (PECVD), spin coating, or direct current superposition (DCS).

Spin coating a thin film of, for example, SOG or spin-on metal (SOM) as the protective film 334 provides the advantage of performing the spin coating in the track system, thereby reducing processing time and cost. Accordingly, in one embodiment, an SOG film is first spin-coated over the organic BARC layer 332 forming the thin protective film 334, and the combined protected organic BARC layer 330 may be hardened using a bake process. The spin-coating and the bake may both be performed using equipment and processes available in the sequential track system.

In another embodiment, illustrated in FIG. 3C, a DCS plasma treatment is performed after forming the organic BARC layer 332. Subjecting the BARC layer 332 to a DCS plasma treatment provides the advantage of curing the BARC layer 332 and depositing the protective film 334 over the top surface in one process step. The semiconductor wafer is positioned on a conductive substrate holder (not shown) below a top electrode 350 in a capacitively coupled plasma (CCP) plasma chamber. The top electrode 350 comprises a silicon film 352 at the bottom side of a metal plate 354, and the substrate holder (not shown) in contact with the substrate serves as the bottom electrode. A high voltage DC source, connected to the metal plate 354 provides negative bias to the top electrode 350 relative to the grounded bottom electrode. The electrodes are configured with RF power and possibly RF bias sources to create plasma 344 in the space between the wafer and the top electrode using, for example, an inert gas such as argon or nitrogen, a mixture of inert gases, or a gaseous mixture comprising hydrogen and an inert gas (e.g., a mixture of hydrogen and nitrogen).

Positive ions (e.g., Ar ions) in the plasma 344 get attracted by the high negative DC bias (roughly 1 kV), accelerate, and strike the bottom silicon film 352 of top electrode 350 producing secondary electrons and sputtering some silicon. A fraction of the sputtered silicon atoms may deposit on the wafer to form a protective film 334 of silicon on the surface. When the silicon in the protective film 334 gets exposed to oxygen (e.g., the oxygen in the air outside the plasma chamber), it oxidizes to silicon oxide. The silicon oxide film then serves as the protective film 334 during a subsequent plasma deposition of the spacer layer, as mentioned above.

The negatively charged secondary electrons are repelled and accelerated downward toward the bottom electrode, creating a flux of ballistic electrons 340, as indicated by the arrows in FIG. 3C. Aided by the high energy acquired from the high negative DC bias, the ballistic electrons 340 may easily pass through the plasma and the sheath to penetrate at least a hundred nanometers into the substrate. The curing process occurs as dangling bonds are created via interactions with ballistic electrons 340 during their passage through the organic BARC, enabling the cross-linking of carbon.

Next, the structure 3200, comprising the cured organic BARC layer 330 formed over the target layer 320 of the incoming wafer, may be processed through the process steps of the photolithography module, as described above with reference to block 130 in FIG. 1.

Figure 4:
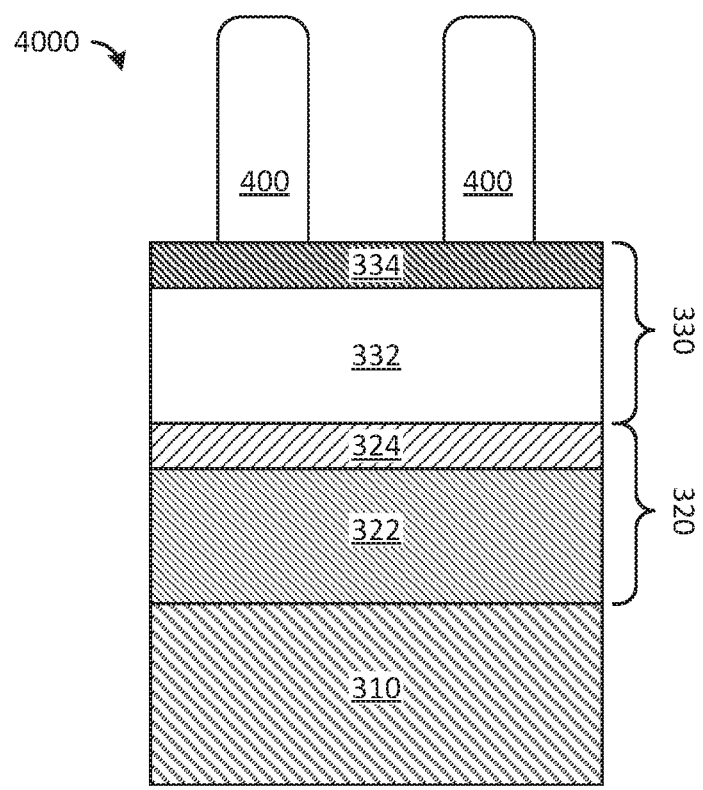

FIG. 4 illustrates a structure 4000, wherein a patterned photoresist layer 400 is the photoresist relief pattern formed over the protected organic BARC layer 330. The relief pattern is the result of the photolithography process steps described above with reference to boxes 132, 134, and 136 in block 130 of the SADP-SIT process flow 100.

Figure 5:
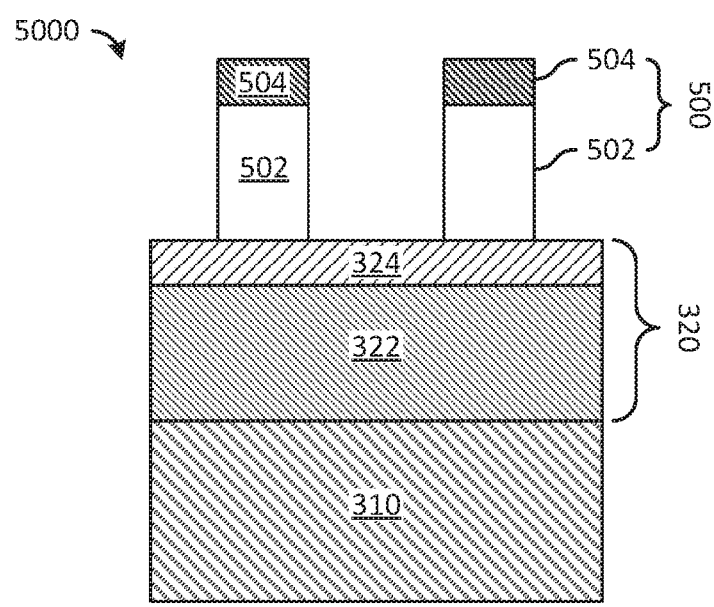

FIG. 5 illustrates a structure 5000 showing a patterned mandrel layer 500 formed after the BARC patterning steps described above by block 140 in the flow diagram of the SADP-SIT process flow 100 in FIG. 1 have been executed. The patterned mandrel layer 500 comprises the materials of the protected organic BARC layer 330 in FIG. 4. In FIG. 5, the mandrel pattern of the patterned photoresist layer 400 is transferred to the protected organic BARC layer 330 (in FIG. 4) by directional etching with an etch chemistry that removes the protected organic BARC layer 330 selectively and stops on the cover layer 324 below. The directional etching may be, for example, reactive ion etching (RIE), performed using oxygen containing plasma, comprising a gas such as $O_2$, CO, $CO_2$, $SO_2$, $NO_2$, or carbonyl sulfide (COS). In some other embodiment, a mixture of $N_2$ and $H_2$ may be used. The photoresist may be removed during the overetch portion of the etching process. The mandrels in the patterned mandrel layer 500 comprise the organic BARC layer 502 and the thin protective layer 504. In the examples, illustrated in FIG. 5, the thin protective layer 504 comprises silicon oxide. In one embodiment, the silicon oxide in the thin protective layer 504 may be SOG. In another embodiment the silicon oxide in the thin protective layer 504 may be oxidized silicon, where the silicon was deposited during a DCS plasma treatment step, as described above.

Figure 6A:
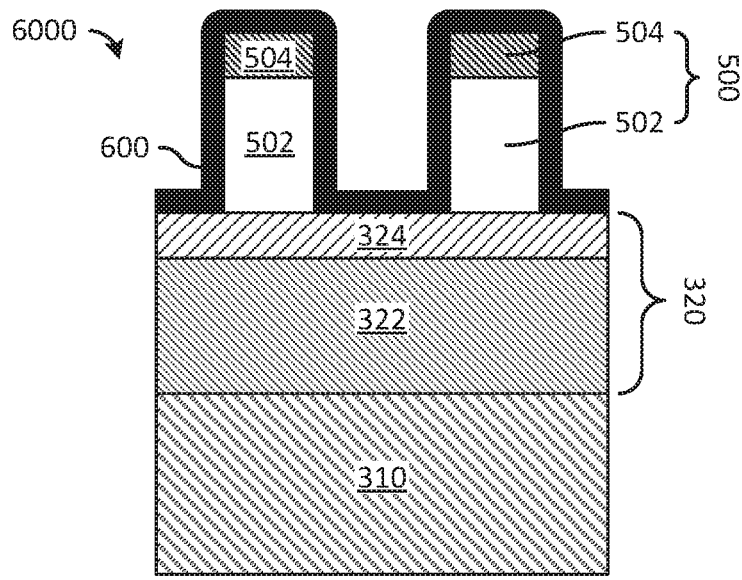
Figure 6B:
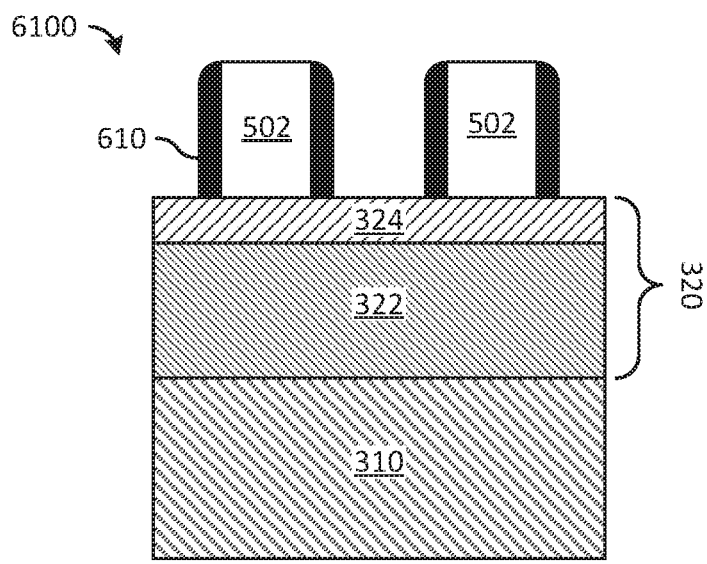
Figure 6C:
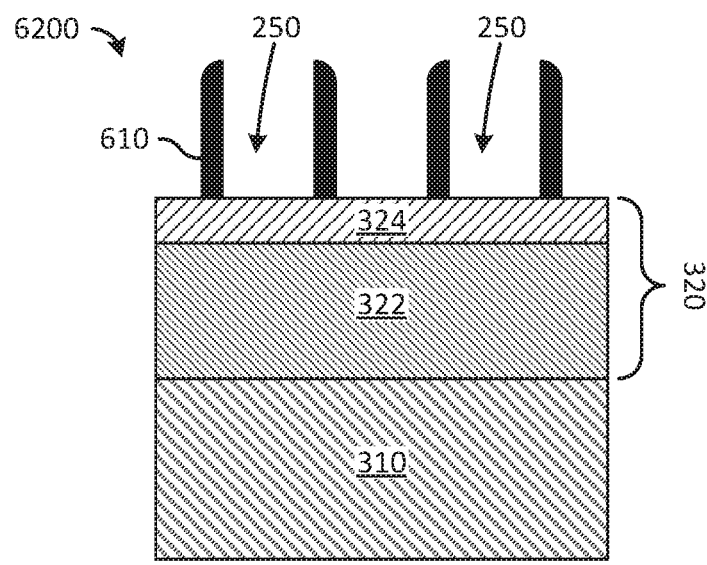

FIGS. 6A-6C illustrate the processing steps used to form a half-pitch spacer pattern, as indicated in block 150 in the flow diagram illustrated in FIG. 1. As described above, self-aligned spacers may be formed on the sidewalls of the patterned mandrel layer 500 (box 152 in FIG. 1) followed by a mandrel pull etch step to remove the patterned mandrel layer 500 (box 154 in FIG. 1).

FIG. 6A illustrates a structure 6000, wherein a spacer layer 600 is formed conformally over the exposed top surface of the cover layer 324, and over the sidewalls and top surfaces of the mandrels in the patterned mandrel layer 500. In order to avoid damaging the patterned organic BARC layer 502, the conformal deposition process may be performed at a low temperature of about 25° C. to about 200° C. using a plasma-enhanced deposition technique, for example, a PEALD technique. In one embodiment, the spacer layer 600 comprises silicon oxide film having a film thickness target of about 5 nm to about 25 nm. The thickness of the spacer layer in an SIT process directly influences the linewidths in the pattern formed in the target layer onto which the half-pitch spacer pattern is to be transferred. Hence, it is advantageous for the spacer to be formed using a technique where the thickness may be precisely controlled, such as in ALD processes. In the example embodiment, for low temperature deposition and precise thickness control, the spacer layer 600 may be formed using a PEALD process with a first precursor gas such as bis(tertiary-butylamino) silane (BTBAS), tetradimethyl-aminosilicon (TDMAS). The second reaction of the PEALD process is an oxidation reaction performed using oxygen plasma. In various embodiments, the spacer layer 600 may comprise titanium oxide, aluminum oxide, or tin oxide formed using a low temperature ALD process. As explained above, the patterned thin protective layer 504 helps reduce plasma damage and prevents deformation of the sidewalls. As illustrated in FIG. 6A, the sidewalls remain vertical after the PEALD process is complete.

In FIG. 6B, the spacer layer 600 (in FIG. 6A) has been removed selectively from over the flat top surfaces of the patterned mandrel layer 500 and the cover layer 324 between mandrels using a directional etch (e.g., RIE using fluorine chemistry, or chlorine chemistry, or the like) to form a structure 6100. The spacer etch process also removes the thin protective layer 504 comprising silicon oxide or SOG, thereby forming freestanding spacers 610 along the sidewalls of the cured and patterned organic BARC layer 502. The organic BARC layer 502 and the cover layer 324 comprising, for example, SiON, may be etch stop layers for the etch chemistry used to form the freestanding spacers 610.

FIG. 6C illustrates a structure 6200 formed after a mandrel pull process (box 154 in FIG. 1) is performed. The mandrels, comprising the cured and patterned organic BARC layer 502 may be removed, using oxygen plasma. In another embodiment, the mandrel pull process may be a wet etch process using a solution of sulfuric acid and hydrogen peroxide, referred to as sulfuric peroxide mix (SPM). Removing the mandrels leaves freestanding spacers 610 and spaces 250, as illustrated in FIG. 6C. The half-pitch spacer pattern, comprising freestanding spacers 610 (e.g., vertical silicon oxide spacers), may be used as a mask to transfer the pattern to one or more underlying layers, as indicated in block 160 of the SADP-SIT process flow 100, illustrated by the flow diagram in FIG. 1.

Figure 7:
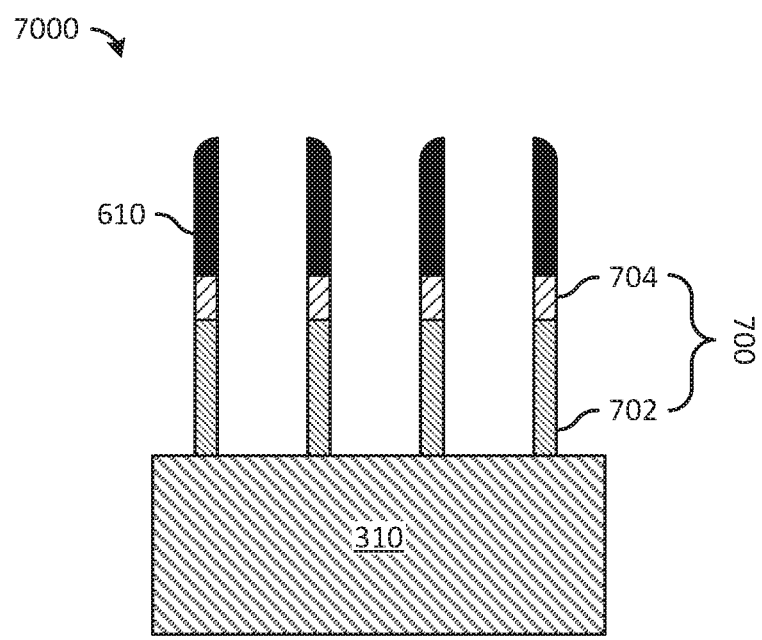

FIG. 7 illustrates a structure 7000 after the pattern transfer process, indicated in block 160 in the SADP-SIT process flow 100 in FIG. 1 is complete. The half-pitch spacer pattern, comprising freestanding spacers 610, has been transferred to the underlying target layer 320 of the structure 6200 to form the patterned target layer 700. As illustrated in FIG. 7, the patterned target layer 700 comprises a patterned cover layer 704 and a patterned primary layer 702.

The example embodiment of SADP-SIT process flow 100, described above, achieves a pitch doubling in the pattern comprising the patterned target layer 700, relative to the pitch of the first pattern comprising the patterned photoresist layer 400 (see FIG. 4). The pitch-splitting patterning uses the self-aligned SIT technique and may be provided at a reduced cost by using a low-cost organic BARC process for the photolithography module and then reusing the organic BARC layer 502 as the mandrel layer for the freestanding spacers 610, as seen in FIG. 6B. High-fidelity pattern transfer has been enabled at the reduced cost by providing a patterned mandrel layer 500 comprising a hardened (by curing) organic BARC layer 502 covered by a thin protective layer 504 (see FIG. 6A).

Example embodiments of this application are summarized here. Other embodiments can also be understood from the entirety of the specification as well as the claims filed herein.

Example 1. A method of patterning a substrate includes depositing an anti-reflective coating layer on a layer stack on a substrate and depositing a layer of photoresist on the substrate subsequent to depositing the anti-reflective coating layer. The method includes forming a latent pattern within the layer of photoresist by exposing the layer of photoresist to a pattern of actinic radiation, developing the layer of photoresist resulting in a relief pattern that includes mandrels, and transferring the relief pattern into the anti-reflective coating layer using a directional etch process. The anti-reflective coating layer resulting in the relief pattern that includes mandrels. The method includes removing the layer of photoresist from the substrate, forming sidewall spacers on mandrels formed from the anti-reflective coating layer, removing the mandrels formed from the anti-reflective coating layer while leaving the sidewall spacers on the substrate, and transferring a pattern defined by the sidewall spacers into one or more underlying layers.

Example 2. The method of example 1, further including depositing a protective film on a top surface of the anti-reflective coating layer prior to depositing the layer of photoresist.

Example 3. The method of one of examples 1 or 2, where the protective film is deposited via atomic layer deposition.

Example 4. The method of one of examples 1 to 3, where the protective film is deposited via chemical vapor deposition.

Example 5. The method of one of examples 1 to 4, where the protective film is deposited via sputter deposition.

Example 6. The method of one of examples 1 to 5, where the protective film is between one nanometer and five nanometers thick.

Example 7. The method of one of examples 1 to 6, where the protective film is a layer of silicon oxide.

Example 8. The method of one of examples 1 to 7, further including treating the anti-reflective coating layer with a flux of ballistic electrons prior to depositing the layer of photoresist.

Example 9. The method of one of examples 1 to 8, further including cross-linking material of the anti-reflective coating layer prior to depositing the layer of photoresist.

Example 10. The method of one of examples 1 to 9, further including depositing a protective film on a top surface of the anti-reflective coating layer prior to depositing the layer of photoresist.

Example 11. The method of one of examples 1 to 10, further including hardening material of the anti-reflective coating layer prior to depositing the layer of photoresist.

Example 12. The method of one of examples 1 to 11, further including depositing a protective film on a top surface of the anti-reflective coating layer prior to depositing the layer of photoresist.

Example 13. A method of forming a device includes forming a hard mask layer over an underlying layer of a substrate, forming an anti-reflective coating layer over the hard mask layer, forming a patterned resist layer over the anti-reflective coating layer, and forming a mandrel including the anti-reflective coating layer by patterning the anti-reflective coating layer using the patterned resist layer as an etch mask. The method includes forming a sidewall spacer on the mandrel including the anti-reflective coating layer, forming a freestanding spacer on the hard mask layer by removing the mandrel from the anti-reflective coating layer, and using the freestanding spacer as an etch mask, patterning the underlying layer of the substrate.

Example 14. The method of example 13, further including, forming a protective film over the anti-reflective coating layer prior to forming the patterned resist layer by direct current superposition.

Example 15. The method of one of examples 13 or 14, further including, cross-linking material of the anti-reflective coating layer prior to forming the patterned resist layer.

Example 16. The method of one of examples 13 to 15, further including forming a protective film over the anti-reflective coating layer by a coating process, spin-coating process, an atomic layer deposition process, a chemical vapor deposition process, or a sputter deposition process.

Example 17. The method of one of examples 13 to 16, where forming the mandrel further includes depositing a protective film over the anti-reflective coating layer and patterning the protective film using the patterned resist layer as the etch mask.

Example 18. A method of forming a device includes forming a hard mask layer over a substrate, forming an anti-reflective coating layer over the hard mask layer, forming a patterned resist layer over the anti-reflective coating layer, forming a mandrel including the anti-reflective coating layer by patterning the anti-reflective coating layer using the patterned resist layer as an etch mask. The method includes forming a sidewall spacer on the mandrel including the anti-reflective coating layer, forming a freestanding spacer on the hard mask layer by removing the mandrel from the anti-reflective coating layer, and transferring a pattern defined by the freestanding spacer into an underlying layer of the substrate.

Example 19. The method of example 18, further including forming a protective film over the anti-reflective coating layer by direct current superposition, where forming the mandrel further includes patterning the protective film using the patterned resist layer as the etch mask.

Example 20. The method of one of examples 18 or 19, further including forming a protective film over the anti-reflective coating layer by exposing the anti-reflective coating layer to an electron beam, where forming the mandrel further includes patterning the protective film using the patterned resist layer as the etch mask.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of patterning a substrate, the method comprising:
   depositing an anti-reflective coating layer on a layer stack on a substrate;
   depositing a layer of photoresist on the substrate subsequent to depositing the anti-reflective coating layer;
   treating the anti-reflective coating layer with a flux of ballistic electrons prior to depositing the layer of photoresist;
   forming a latent pattern within the layer of photoresist by exposing the layer of photoresist to a pattern of actinic radiation;
   developing the layer of photoresist resulting in a relief pattern that includes mandrels;
   transferring the relief pattern into the anti-reflective coating layer using a directional etch process, the anti-reflective coating layer resulting in the relief pattern that includes mandrels;
   removing the layer of photoresist from the substrate;
   forming sidewall spacers on mandrels formed from the anti-reflective coating layer;
   removing the mandrels formed from the anti-reflective coating layer, while leaving the sidewall spacers on the substrate; and
   transferring a pattern defined by the sidewall spacers into one or more underlying layers.

2. The method of claim 1, further comprising depositing a protective film on a top surface of the anti-reflective coating layer prior to depositing the layer of photoresist.

3. The method of claim 2, wherein the protective film is deposited via atomic layer deposition.

4. The method of claim 2, wherein the protective film is deposited via chemical vapor deposition.

5. The method of claim 2, wherein the protective film is deposited via sputter deposition.

6. The method of claim 2, wherein the protective film is between one nanometer and five nanometers thick.

7. The method of claim 2, wherein the protective film is a layer of silicon oxide.

8. The method of claim 1, further comprising cross-linking material of the anti-reflective coating layer prior to depositing the layer of photoresist.

9. The method of claim 8, further comprising depositing a protective film on a top surface of the anti-reflective coating layer prior to depositing the layer of photoresist.

10. The method of claim 1, further comprising hardening material of the anti-reflective coating layer prior to depositing the layer of photoresist.

11. The method of claim 10 further comprising depositing a protective film on a top surface of the anti-reflective coating layer prior to depositing the layer of photoresist.

12. A method of forming a device, the method comprising:
   forming a hard mask layer over an underlying layer of a substrate;
   forming an anti-reflective coating layer over the hard mask layer;
   forming a patterned resist layer over the anti-reflective coating layer;
   cross-linking material of the anti-reflective coating layer prior to forming the patterned resist layer;
   forming a mandrel comprising the anti-reflective coating layer by patterning the anti-reflective coating layer using the patterned resist layer as an etch mask;
   forming a sidewall spacer on the mandrel comprising the anti-reflective coating layer;
   forming a freestanding spacer on the hard mask layer by removing the mandrel from the anti-reflective coating layer; and
   using the freestanding spacer as an etch mask, patterning the underlying layer of the substrate.

13. The method of claim 12, further comprising, forming a protective film over the anti-reflective coating layer prior to forming the patterned resist layer by direct current superposition.

14. The method of claim 12, further comprising forming a protective film over the anti-reflective coating layer by a coating process, spin-coating process, an atomic layer deposition process, a chemical vapor deposition process, or a sputter deposition process.

15. The method of claim 12, wherein forming the mandrel further comprises depositing a protective film over the anti-reflective coating layer and patterning the protective film using the patterned resist layer as the etch mask.

16. A method of forming a device, the method comprising:
   forming a hard mask layer over a substrate;
   forming an anti-reflective coating layer over the hard mask layer;
   forming a protective film over the anti-reflective coating layer by direct current superposition;
   forming a patterned resist layer over the anti-reflective coating layer;
   forming a mandrel comprising the anti-reflective coating layer by patterning the anti-reflective coating layer using the patterned resist layer as an etch mask, wherein forming the mandrel comprises patterning the protective film using the patterned resist layer as the etch mask;

forming a sidewall spacer on the mandrel comprising the anti-reflective coating layer;

forming a freestanding spacer on the hard mask layer by removing the mandrel from the anti-reflective coating layer; and transferring a pattern defined by the freestanding spacer into an underlying layer of the substrate.

17. The method of claim 16, wherein forming the protective film over the anti-reflective coating layer by direct current superposition comprises exposing the anti-reflective coating layer to an electron beam.

* * * * *